United States Patent
Liu (10) Patent No.: US 9,349,729 B2
(45) Date of Patent: May 24, 2016

(54) SEMICONDUCTOR STRUCTURES AND FABRICATION METHOD THEREOF

(71) Applicant: Semiconductor Manufacturing International (Shanghai) Corporation, Shanghai (CN)

(72) Inventor: Huanxin Liu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/681,201

(22) Filed: Apr. 8, 2015

(65) Prior Publication Data

US 2015/0348788 A1 Dec. 3, 2015

(30) Foreign Application Priority Data

May 28, 2014 (CN) .......................... 2014 1 0231340

(51) Int. Cl.
| | |
|---|---|
| *H01L 21/28* | (2006.01) |
| *H01L 21/8234* | (2006.01) |
| *H01L 29/66* | (2006.01) |
| *H01L 27/088* | (2006.01) |
| *H01L 21/321* | (2006.01) |
| *H01L 29/51* | (2006.01) |
| *H01L 29/78* | (2006.01) |
| *H01L 29/165* | (2006.01) |
| *H01L 21/8238* | (2006.01) |
| *H01L 27/092* | (2006.01) |

(52) U.S. Cl.
CPC .......... *H01L 27/088* (2013.01); *H01L 21/3212* (2013.01); *H01L 21/82345* (2013.01); *H01L 21/823842* (2013.01); *H01L 29/66545* (2013.01); *H01L 21/823814* (2013.01); *H01L 27/092* (2013.01); *H01L 29/165* (2013.01); *H01L 29/517* (2013.01); *H01L 29/66636* (2013.01); *H01L 29/7848* (2013.01)

(58) Field of Classification Search
CPC ................. H01L 21/28132; H01L 21/283437; H01L 21/823462; H01L 29/66545
See application file for complete search history.

(56) References Cited

U.S. PATENT DOCUMENTS

| | | | |
|---|---|---|---|
| 2013/0095644 A1* | 4/2013 | Tu ..................... | H01L 29/66545 438/585 |
| 2014/0367801 A1* | 12/2014 | Liu .................... | H01L 29/42376 257/407 |

* cited by examiner

*Primary Examiner* — Christine Enad
(74) *Attorney, Agent, or Firm* — Anova Law Group, PLLC (57) ABSTRACT

A method for fabricating a semiconductor structure includes providing a semiconductor substrate having a first region and a second region; and forming a first dummy gate on the semiconductor substrate in the first region and a device layer on the semiconductor substrate in the second region. The method also includes forming a dielectric layer on of the first dummy gate and the device layer; and removing the first dummy gate to form a first trench. Further, the method includes forming a first metal layer on the first trench and the surfaces of the dielectric layer and the device layer; and performing a first planarization process onto the first metal layer using a polishing slurry having a first protective agent to form a first gate electrode in the first trench and form a protective layer on the device layer preventing the device layer being damaged during the first planarization process.

20 Claims, 7 Drawing Sheets

SEMICONDUCTOR STRUCTURES AND FABRICATION METHOD THEREOF

CROSS-REFERENCES TO RELATED APPLICATIONS

This application claims the priority of Chinese patent application No. 201410231340.5, filed on May 28, 2014, the entirety of which is incorporated herein by reference.

FIELD OF THE INVENTION

The present invention generally relates to the field of semiconductor manufacturing technology and, more particularly, relates to semiconductor structures and fabrication techniques thereof.

BACKGROUND

With the continuous increasing of the integration level of semiconductor devices, and the continuous decreasing of the technical node, the thickness of the conventional gate dielectric layer of the semiconductor devices has become smaller and smaller, but the leakage current of the gate electrode of a transistor has been increased. The increasing of the leakage current has caused certain issues including increasing the power consumptions, etc. In order to solve the leakage current issue and other related issues, a technique which uses a metal gate to substitute the conventional polysilicon gate has been developed. The gate structure having the metal gate and a high dielectric constant (high-K) gate dielectric layer is referred as a high-K metal gate (HKMG) structure. A gate-last process is a major process for forming the HKMG structure.

A process for forming a transistor with an HKMG structure includes providing a semiconductor substrate; and forming a dummy gate structure on the surface of the semiconductor substrate. The dummy gate structure includes a dummy gate dielectric layer formed on the surface of the semiconductor substrate; and a dummy gate electrode layer formed on the surface of the gate dielectric layer. The process also includes forming sidewall spacers on the side surfaces of the dummy gate structure; and forming an interlayer dielectric layer on the surface of the semiconductor substrate. The interlayer dielectric layer covers the surface of the semiconductor substrate and the side surface of the dummy gate structure; and the surface of the interlayer dielectric layer levels with the surface of the dummy gate structure.

Further, the process includes removing the dummy gate structure to form an opening; and sequentially forming a high-K dielectric layer, a work function layer, and a metal layer on the surface of the semiconductor substrate exposed by the opening. Further, the process also includes forming a stop layer; and planarizing the metal layer by a chemical mechanical polishing (CMP) process to form a metal gate.

Transistors having the HKMG structures are often formed in the core regions of the chip, such as logic regions, etc. Devices formed in the peripheral regions of the chip, such as the input/output regions, etc., still use polysilicon as the gate electrode material. Further, there are other device layers made of polysilicon or other materials are formed on the chip, such as polysilicon resistors, etc. When the CMP process is used to planarize the metal layer to form the metal gate, because the CMP process has a relative high polishing rate to polysilicon, etc., the device layers in other regions are often damaged by the CMP process; and certain defects, such as polishing dishes, etc., are formed on the top surface of the device layers; and contaminating residuals may be formed in the polishing dishes. Thus, the performance of the device layers may be affected. The disclosed device structures and methods are directed to solve one or more problems set forth above and other problems.

BRIEF SUMMARY OF THE DISCLOSURE

One aspect of the present disclosure includes method for fabricating a semiconductor structure. The method includes providing a semiconductor substrate having a first region and a second region; and forming a first dummy gate on a surface of the semiconductor substrate in the first region and a device layer with a top surface leveling with a top surface of the first dummy gate on the surface of the semiconductor substrate in the second region. The method also includes forming a dielectric layer on the first dummy gate and the device layer and with a top surface leveling the top surfaces of the first dummy gate and the device layer on the semiconductor substrate; and removing the first dummy gate to form a first trench. Further, the method includes forming a first metal layer on the first trench to fill the first trench, on the surface of the dielectric layer and the surface of the device layer; and performing a first planarization process on the first metal layer using a first polishing slurry with a first protective agent to form a first gate electrode in the first trench and form a protective layer on the device layer preventing the device layer being damaged during the first planarization process.

Another aspect of the present disclosure includes a semiconductor structure. The semiconductor structure includes a semiconductor substrate having a first region and a second region; and a first gate electrode formed on a surface of semiconductor substrate in the first region by a first planarization process using a first polishing slurry including a first protective agent. The semiconductor structure also includes a device layer formed on the surface of the semiconductor substrate in the second region; and a protective layer formed on a top surface of the device layer by a reaction between a protective agent and the device layer during the first planarization process such that the device layer is not damaged from the first planarization process. Further, the semiconductor structure includes first source/drain regions formed in the semiconductor substrate at both sides of the first gate electrode; and second source/drain regions formed in the semiconductor substrate at both sides of the device layer Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 11:
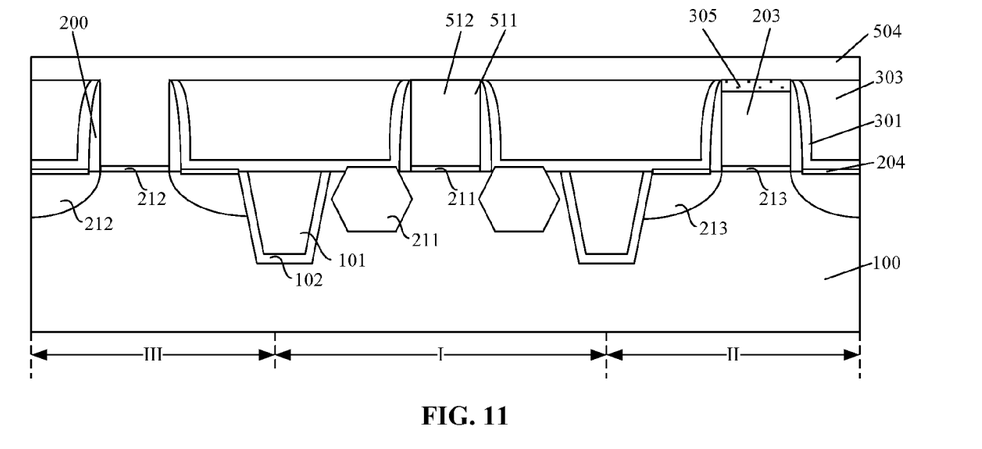
Figure 12:
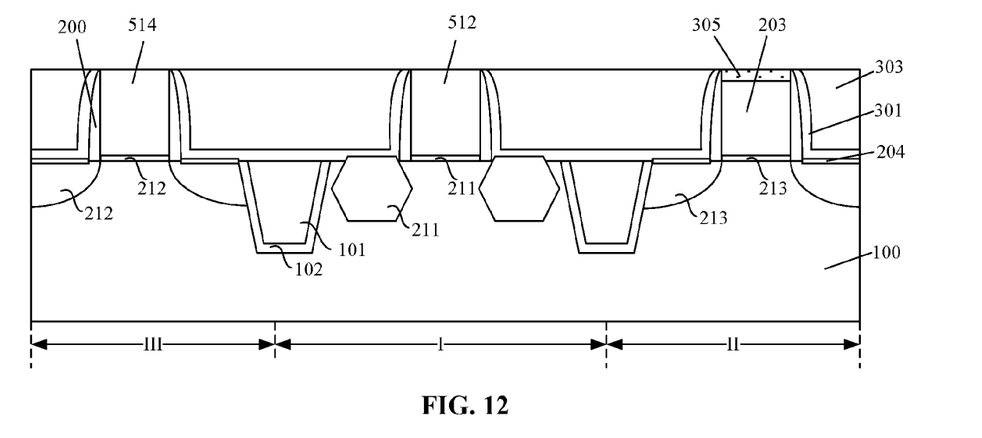
Figure 13:
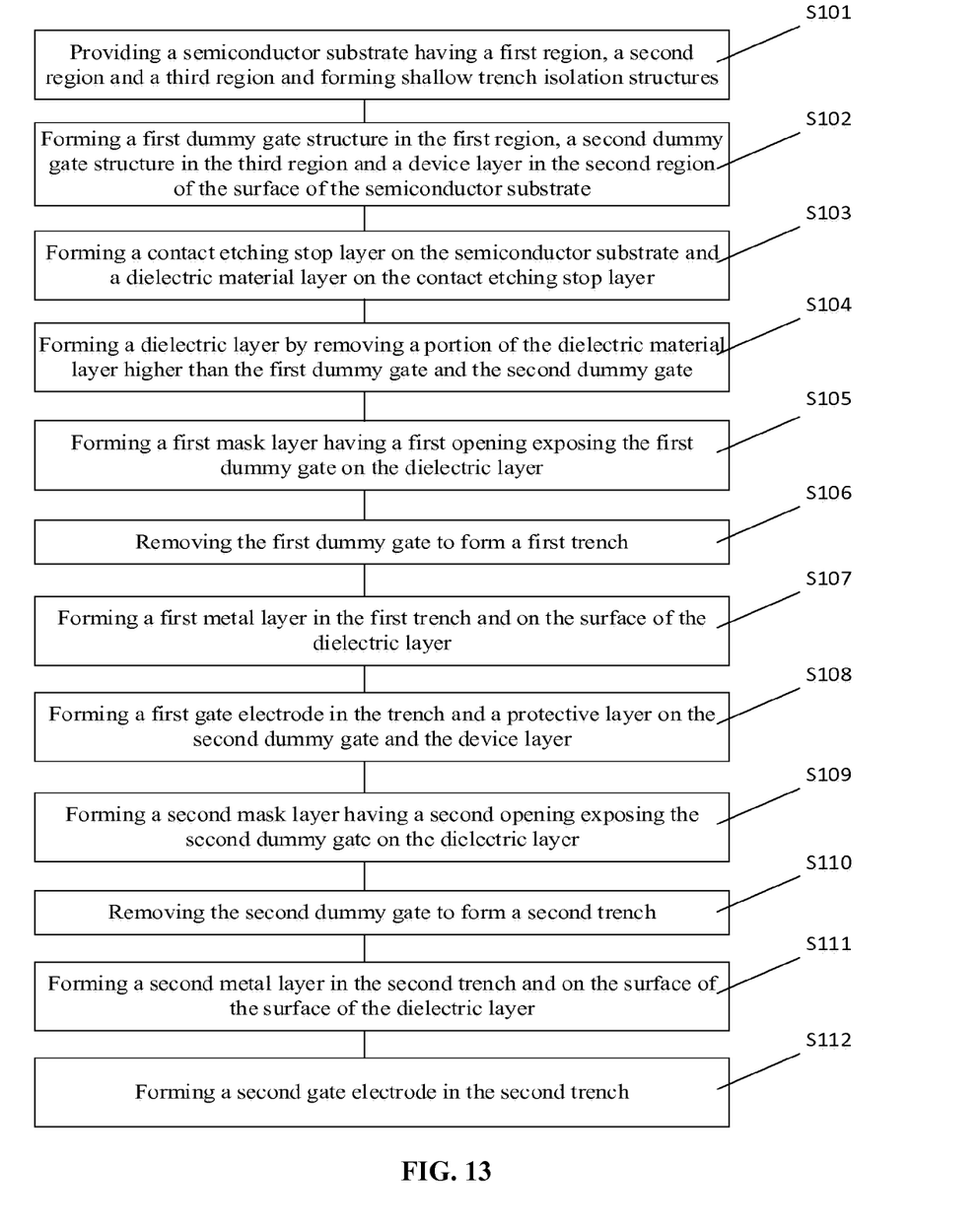
FIG. 13 illustrates an exemplary fabrication process of a semiconductor structure consistent with the disclosed embodiments.

FIG. 13 illustrates an exemplary fabrication process of a semiconductor structure consistent with the disclosed embodiments; and FIGS. 2~12 illustrate semiconductor structures corresponding to certain stages of the exemplary fabrication process of a semiconductor structure.

Figure 1:
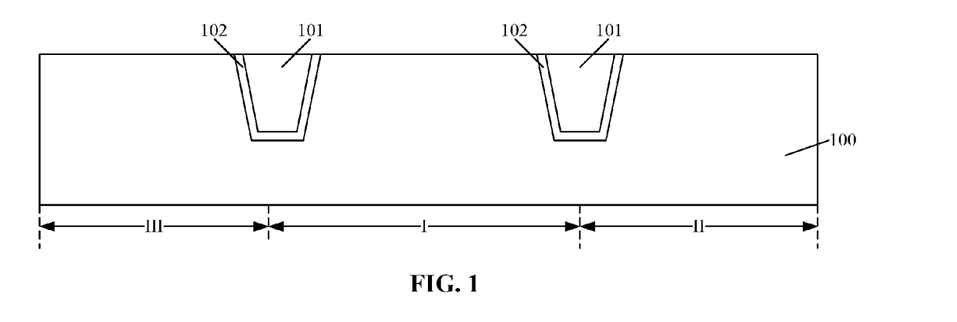
FIGS. 1~12 illustrate semiconductor structures corresponding to certain stages of an exemplary fabrication process of a semiconductor structure consistent with the disclosed embodiments.

As shown in FIG. 13, at the beginning of the fabrication process, a substrate with certain structures is provided (S101). FIG. 1 illustrates a corresponding semiconductor structure.

As shown in FIG. 1, a semiconductor substrate 100 is provided. The semiconductor substrate 100 may have a first region I, a second region II and a third region III. The first region I, the second region II, and the third region III may be isolated by shallow trench isolation (STI) structures (not labeled). The STI structures may include a padding layer 102 formed in the surface of the semiconductor substrate 100; and an insulation layer 101 formed on the surface of the padding layer 101.

The semiconductor substrate 100 may include any appropriate semiconductor materials, such as single crystal silicon, polysilicon, silicon on insulator (SOI), silicon germanium, carborundum, indium antimonide, lead telluride, indium arsenide, indium phosphide, gallium arsenide, gallium antimonite, alloy semiconductor or a combination thereof. The type of the semiconductor substrate 100 may be chosen according to the type of the semiconductor devices subsequently formed on the semiconductor substrate 100. In one embodiment, the substrate 100 is single crystalline silicon. The semiconductor substrate 100 provides a base for subsequent devices and processes.

The first region I and the third region III of the semiconductor substrate 100 may be used to subsequently form transistors with HKMG structures. The second region II of the semiconductor substrate 100 may be used to subsequently form other transistors and semiconductor devices, such as resistors and capacitors, etc. In one embodiment, a PMOS transistor having an HKMG structure may be subsequently formed in the first region I by a gate-last process; an NMOS transistor having a polysilicon gate electrode may be subsequently formed in the second region II by a gate-first process; and an NMOS transistor with an HKMG structure may be subsequently formed in the third region III by a gate-last process.

Referring to FIG. 1, the STI structures may be used to electrically isolate the first region I, the second region II and the third region III. A method for forming the STI structures may include sequentially forming shallow trenches (not labeled) in the surface of the semiconductor substrate 100 by etching the semiconductor substrate 100; forming the padding layer 102 on the inner side surface of the shallow trenches; and forming the isolation layer 101 on the padding layer 102. Thus, the STI structures may include the padding layer 102 and the isolation layer 101. The padding layer 102 may be able to repair the defects on the inner surface of the shallow trenches; and eliminate the stress effect of the isolation layer 101 to the semiconductor substrate 100.

Figure 2:
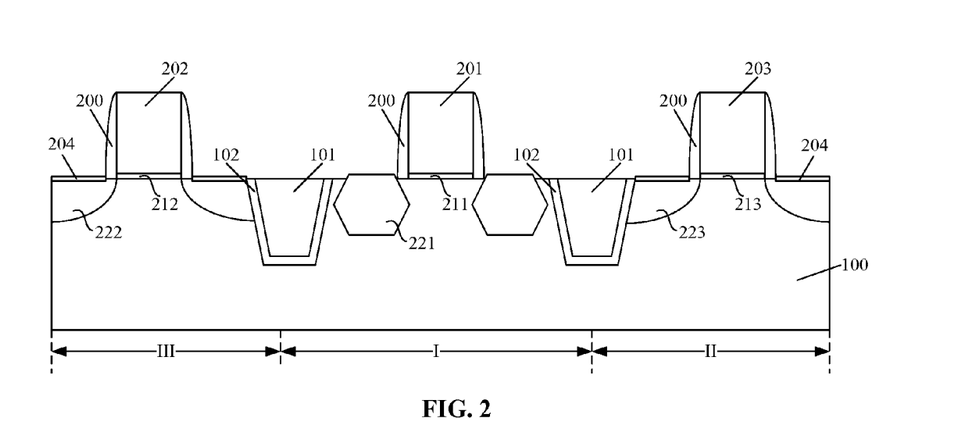

Returning to FIG. 13, after providing the semiconductor substrate 100 with the STI structures, a first dummy gate, a second dummy gate and a device layer may be formed (S102). FIG. 2 illustrates a corresponding semiconductor structure.

As shown in FIG. 2, a first dummy gate 201 is formed on a portion of the surface of the semiconductor substrate 100 in the first region I. A second dummy gate 202 is formed on a portion of the surface of the semiconductor substrate 100 in the third region III. A device layer 203 is formed on a portion of the surface of the semiconductor substrate 100 in the second region II.

Further, a first gate dielectric layer 211 may be formed between the first dummy gate 201 and the surface of the semiconductor substrate 100; and a second gate dielectric layer 212 may be formed between the second dummy gate 202 and the surface of the semiconductor substrate 100. In one embodiment, the device layer 203 may be a gate electrode of a to-be-formed transistor on the surface of the semiconductor substrate 100 in the second region II, thus a third gate dielectric layer 213 may be formed between the device layer 203 and the surface of the semiconductor substrate 100.

In one embodiment, a method for forming the first dummy gate 201, the first gate dielectric layer 211, the second dummy gate 202, the second dummy gate dielectric layer 212, the device layer 203 and the third gate dielectric layer 213 may include sequentially forming a gate dielectric film on the surface of the semiconductor substrate 100 and the surface of the STI structures; forming a dummy gate electrode film on the gate dielectric film; forming a patterned mask layer defining the size and the positions of the first dummy gate 201, the second dummy gate 202 and the device layer 203 on the surface of the dummy gate film; and etching dummy gate film and the gate dielectric film using the patterned mask layer as an etching mask. Thus, the first gate dielectric layer 211 may be formed on the first region I; and the first dummy gate 201 may be formed on the first gate dielectric layer 211; the third gate dielectric layer 213 may be formed on the second region II and the device layer 203 may be formed on the third gate dielectric layer 213; and the second gate dielectric layer 212 may be formed on the third region III and the second dummy gate 202 may be formed on the second gate dielectric layer 212.

The gate dielectric film may be made of any appropriate material, such as silicon oxide, or a high-K material including one of HfO, ZrO, AlO, HfSiO, ZrSiO, etc. In one embodiment, the gate dielectric layer is made of silicon oxide. The dummy gate film may be made of polysilicon, etc.

Various processes may be used to form the gate dielectric film, such as a thermal oxidation process, a chemical oxidation process, a chemical vapor deposition (CVD) process, a physical vapor deposition (PVD) process, or an atomic layer deposition (ALD) process, etc. The dummy gate film may be formed by any appropriate process, such as a CVD process, a PVD process, or a flowable CVD (FCVD) process, etc.

In certain other embodiments, the first dummy gate 201 and the first gate dielectric layer 211, the second dummy gate 202 and the second gate dielectric layer 212, and the device layer 203 and the third gate dielectric layer 213 may be formed separately. The third gate dielectric layer 213 may be made of silicon oxide; and the first gate dielectric layer 211 and the second gate dielectric layer 212 may be made of high-K material. In certain other embodiments, the first gate dielectric layer 211 and the second gate dielectric layer 212 may be omitted.

In certain other embodiments, the device layer 203 may be other devices, such as resistors, or inductors, etc. The device layer 203 may be made of other semiconductor materials, such as SiGe, Ge, or SiC, etc.

Referring to FIG. 2, after forming the first dummy gate 201, the first gate dielectric layer 211, the second dummy gate 202, the second gate dielectric layer 212, and the device layer 203 and the third gate dielectric layer 213, a sidewall spacer 200 may be formed on the side surfaces of the first dummy gate 201, the first gate dielectric layer 211, the second dummy gate 202, the second gate dielectric layer 212, the device layer 203 and the third gate dielectric layer 213. The sidewall spacer 200 may be made of any appropriate material, such as one or more of silicon oxide, silicon nitride, or silicon oxynitride, etc.

Further, referring to FIG. 2, after forming the sidewall spacer 200, first source/drain regions 221 may be formed in the first region I of the semiconductor substrate 200 at both sides of the first dummy gate 201; second source/drain regions 222 may be formed in the third region III of the semiconductor substrate at both sides of the second dummy gate 202; and third source/drain regions 223 may be formed in the second region II of the semiconductor substrate 200 at both sides of the device layer 203.

In one embodiment, the to-be-formed transistor on the second region II and the third region III may be NMOS transistors, N-type doped second source/drain regions 222 and third source/drain regions 223 may be formed by an ion implantation process. The second source/drain regions 222 and the third source drain regions 223 may be formed at a same time. In certain other embodiments, the second source/drain regions 223 may be formed separately.

The to-be-formed transistor on the first region may be a PMOS transistor, a method for forming the first source/drain regions 221 may include sequentially forming trenches (not labeled) in the semiconductor substrate 200 at both sides of the first dummy gate 201; and forming P-type doped SiGe layers in the trenches as the first source/drain regions 221. The trenches may be formed by any appropriate process, such as a dry etching process, or a wet etching process, etc. In one embodiment, the trenches are formed by a wet etching process; and a side surface of the trenches may have a "Σ" shape. Because the SiGe layers may have a relatively high hole carrier mobility; and the SiGe layers may apply a compressive stress to the semiconductor substrate 100 under the first dummy gate 201, the carrier mobility of the to-be-formed PMOS transistor on the first region I may be increased.

Further, referring to FIG. 2, after forming the second source/drain regions 222 and the third source/drain regions 223, a metal silicide layer 204 may be formed on the surfaces of the second source/drain regions 222 and the third source/drain regions 223. The metal silicide layer 204 may be used to reduce the surface contact resistance of the second source/drain regions 222 and the third source/drain regions 223. The surface contact resistance of the first source/drain regions 221 may be relatively low, thus it may be unnecessary to form a metal silicide layer on the surfaces of the first source/drain regions 221. In certain other embodiments, a metal silicide layer may be formed on the surfaces of the first source/drain regions 221 simultaneously when the metal silicide layer 204 is formed on the surfaces of the second source/drain regions 222 and the third source/drain regions 223.

Figure 3:
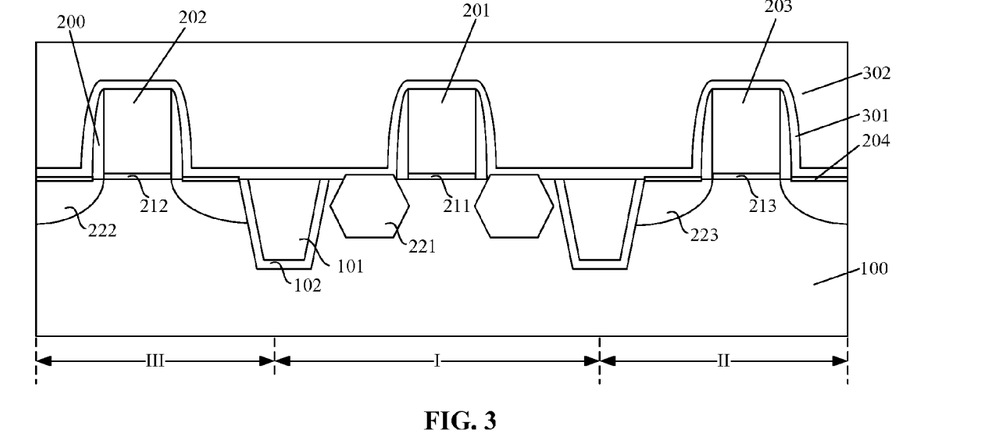

Returning to FIG. 13, after forming the metal silicide layer 204, a contact etching stop layer and a dielectric material layer may be formed (S103). FIG. 3 illustrates a corresponding semiconductor structure.

As shown in FIG. 3, a contact etching stop layer 301 is formed on the surfaces of the semiconductor substrate 100 and the STI structures. The contact etching stop layer 301 may also cover the side surfaces of the sidewall spacer 200. Further, a dielectric material layer 302 is formed on the contact etching stop layer 301.

The contact etching stop layer 301 may be used as a stop layer for subsequently forming through holes on the surfaces of the first source/drain regions 221, the second source/drain regions 222 and the third source/drain regions 223 by an etching process. The contact etching stop layer 301 may be made of any appropriate material, such as silicon oxide, silicon nitride, or silicon oxynitride, etc. In one embodiment, the contact etching stop layer 301 is made of silicon nitride.

After forming the contact etching stop layer 301, the dielectric material layer 302 may be formed on the surface of the contact etching stop layer 301. The dielectric material layer 302 may be made of any appropriate material, such as silicon oxide, silicon oxynitride, or silicon oxycarbide, etc. Various processes may be used to form the dielectric material layer 302, such as a CVD process, a PVD process, a spin-coating process, or a high aspect ratio CVD (HARP CVD) process. In one embodiment, the dielectric material layer 302 is made of silicon oxide; and is formed by a HARP CVD process.

Figure 4:
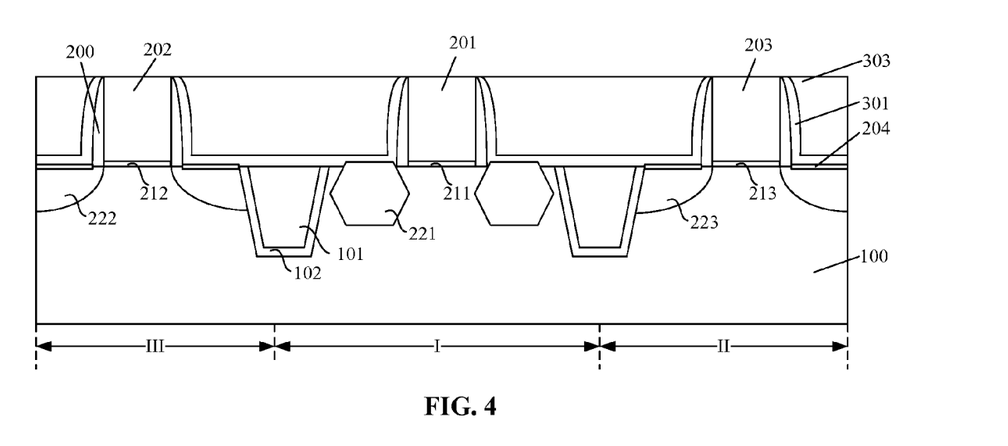

Returning to FIG. 13, after forming the dielectric material layer 302, a dielectric layer may be formed (S104). FIG. 4 illustrates a corresponding semiconductor structure.

As shown in FIG. 4, a dielectric layer 303 is formed by planarizing the dielectric material layer 302 until the top surfaces of the first dummy gate 201, the second dummy gate 202 and the device layer 203 are exposed. The surface of the dielectric layer 303 may level with the top surfaces of the first dummy gate 201, the second dummy gate 202 and the device layer 203.

The dielectric material layer 302 may be planarized by any appropriate process, such as a physical mechanical polishing process, or a chemical mechanical polishing (CMP) process, etc. In one embodiment, a CMP process is used to planarize the dielectric material layer 302. A portion of the dielectric material layer 302 and a portion of the contact etching stop layer 301 higher than the top surfaces of the first dummy gate 201, the second dummy gate 202 and the device layer 203 may be removed by the CMP process. Thus, the top surfaces of the first dummy gate 201, the second dummy gate 202 and the device layer 203 may be exposed.

Figure 5:
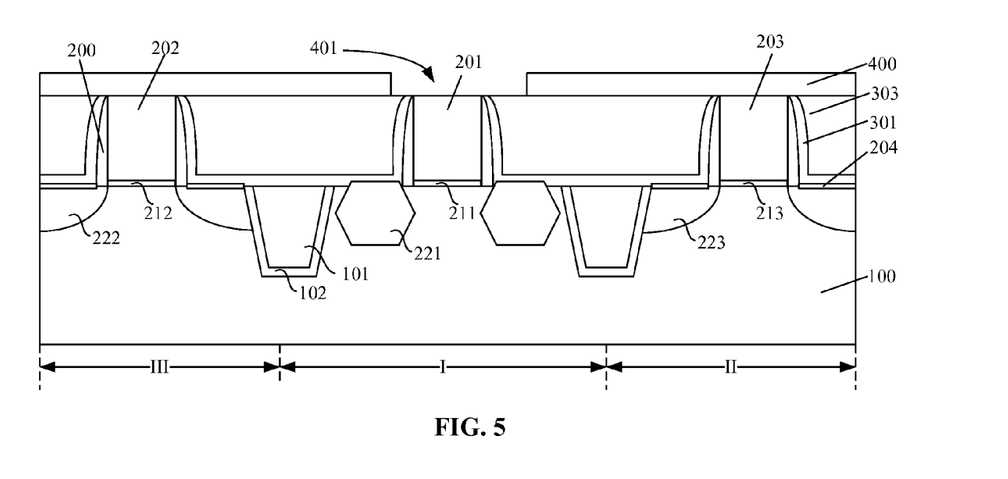

Returning to FIG. 13, after forming the dielectric layer 303, a first mask layer may be formed (S105). FIG. 5 illustrates a corresponding semiconductor structure.

As shown in FIG. 5, a first mask layer 400 having a first opening 401 is formed on the surface of the dielectric layer 303, the surface of the device layer 203 and the surface of the second dummy gate 202. The first opening 401 may expose the surface of the first dummy gate 201.

The first mask layer 400 may be made of any appropriate material, such as photoresist, silicon oxide, or silicon nitride, etc. In one embodiment, the first mask layer 400 is made of photoresist. A method for forming the first mask layer 400 with the first opening 401 may include forming a photoresist layer on the surfaces of the dielectric layer 303, the first dummy gate 201, the second dummy gate 202, and the device layer 203; and followed by exposing and developing the photoresist layer. Thus, the first mask layer 400 having the first opening 401 is formed.

Referring to FIG. 5, in one embodiment, the first opening 401 may expose a portion of the surface of the dielectric layer 303 at both sides of the first dummy gate 201, thus the entire surface of the first dummy gate 201 may be exposed. Therefore, when an etching process is subsequently used to remove the first dummy gate 201, the entire first dummy gate 201 may be removed.

Figure 6:
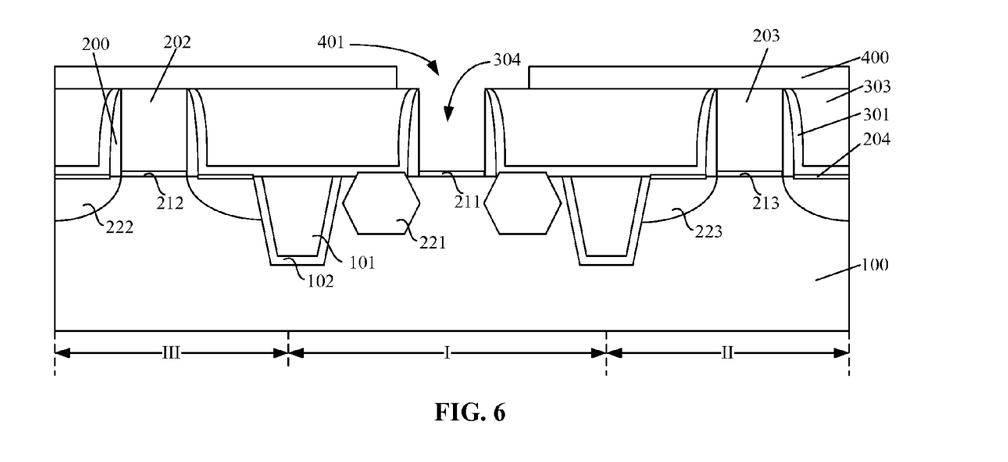

Returning to FIG. 13, after forming the first mask layer 400 with the first opening 401, the first dummy gate 201 may be removed (S106). FIG. 6 illustrates a corresponding semiconductor structure.

As shown in FIG. 6, the first dummy gate 201 is removed; and a first trench 304 is formed. The first dummy gate 201 may be removed by any appropriate process, such as a wet etching process, or a dry etching process, etc. In one embodiment, the first dummy gate 201 is removed by a dry etching process. The etching gas of the dry etching process may include $CF_4$, $SF_6$, and $O_2$, etc. In certain other embodiments, the first dummy gate 201 is removed by a wet etching process.

The etching solution of the wet etching process may be a KOH solution, or a tetramethylammonium hydroxide (TMAH) solution, etc. The wet etching process may have a relatively high etching selectivity, thus it may avoid the relatively large damage to the first gate dielectric layer 211.

In one embodiment, the first gate dielectric layer 211 may be removed after removing the first dummy gate 201, thus the surface of the substrate 100 on the bottom of the first trench 304 may be exposed. In certain other embodiments, if the first gate dielectric layer 211 is not formed on the surface of the substrate 100, after removing the first dummy gate 201, the surface of the substrate 100 on the bottom of the first trench 304 may be exposed.

Figure 7:
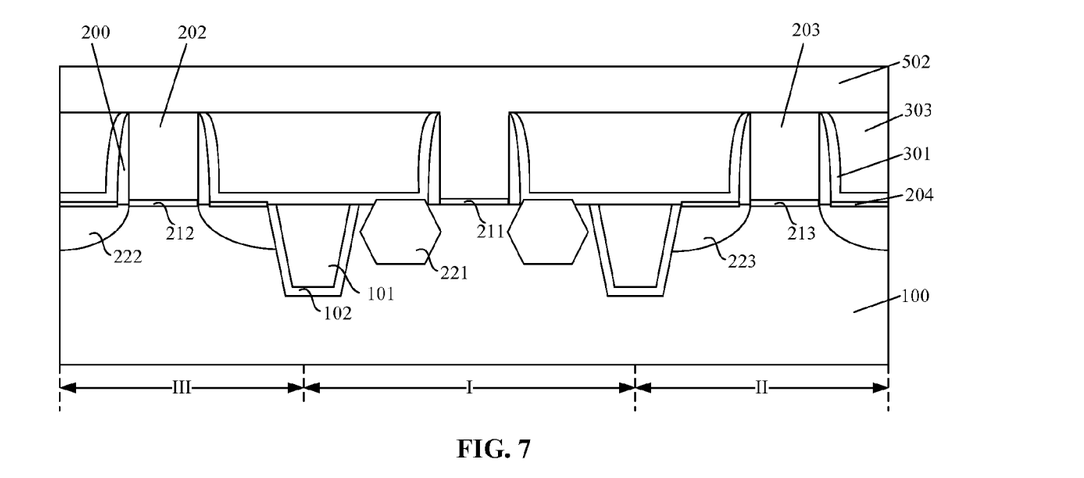

Returning to FIG. 13, after forming the first opening 304, the first mask layer 400 may be removed; and a first metal layer may be formed (S107). FIG. 7 illustrates a corresponding semiconductor structure.

As shown in FIG. 7, the first mask layer 400 is removed; and a first metal layer 502 is formed in the first trench 304 and the surfaces of the dielectric layer 303, the device layer 203; and the second dummy gate 202. The first metal layer 502 may fill up the first trench 304. The first mask layer 400 may be removed by any appropriate process, such as a dry etching process, a wet etching process, or a plasma ashing process, etc.

The first metal layer 502 may be made of any appropriate material, such as Al, Ti, W, Ta, TiN, or TaN, etc. In one embodiment, the first metal layer 502 is made of Al. Various processes may be used to form the first metal layer 502, such as a sputtering process, an electroplating process, a PVD process, a CVD process, or an FCVD process, etc.

In certain other embodiments, the first gate dielectric layer 211 may not be formed on the bottom of the first trench 304, a first gate dielectric material layer (not shown) may be formed on the side surface and the bottom surface of the first trench 304 and the surfaces of the dielectric layer 303, the device layer 203 and the second dummy gate 202 before forming the first metal layer 502. The first gate dielectric material layer may be subsequently planarized to form the high-K gate dielectric layer of the transistor formed on the first region I. The first gate dielectric material layer may be a high-K dielectric material, such as HfO, ZrO, AlO, HfSiO, or, ZrSiO, etc. Various processes may be used to form the first gate dielectric material layer, such as a CVD process, a PVD process, or an FCVD process, etc.

In certain other embodiments, a work function layer (not shown) may be formed on the side surface of the first trench 304 and the surfaces of the dielectric layer 303, the device layer 203, and the second dummy gate 202 before forming the first metal layer 502. The work function layer may be used to adjust the work function of the transistor. The metal layer 502 may be formed on the surface of the work function layer.

Figure 8:
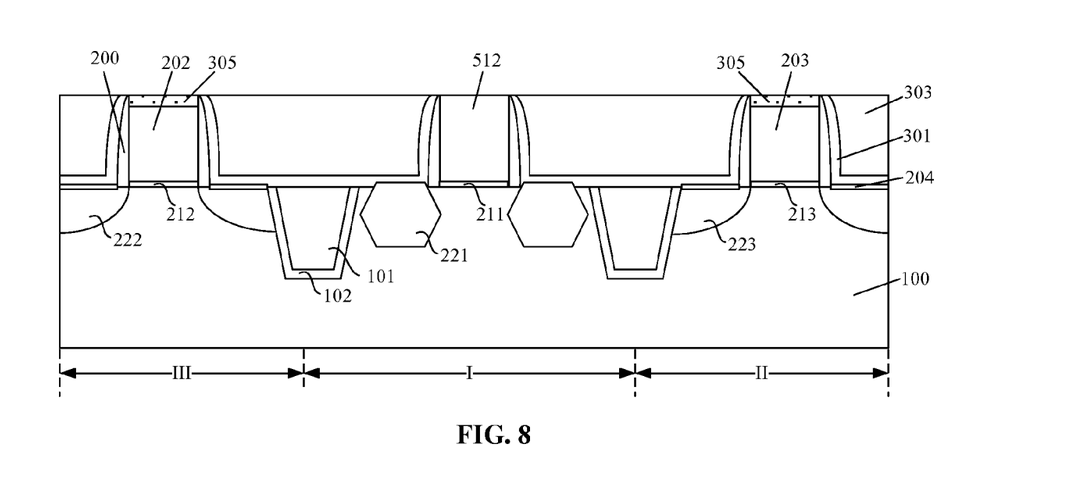

Returning to FIG. 13, after forming the first metal layer 502, a first planarization process may be performed onto the first metal layer 502 (S108). FIG. 8 illustrates a corresponding semiconductor structure.

As shown in FIG. 8, a portion of the first metal layer 502 higher the top surfaces of the dielectric layer 303, the second dummy gate 202 and the device layer 203 is removed by a first planarization process; and the first gate electrode 512 is formed. The first planarization process may be any appropriate process, such as a CMP process, or a physical mechanical polishing process, etc. In one embodiment, the first planarization process is a CMP process. The polishing slurry, may be referred as a first polishing slurry, of the first planarization process may include a first protective agent. The first protective agent may form a protective layer 305 on the surface of the device layer 203 and the second dummy gate 202 during the first planarization process.

In one embodiment, the first polishing slurry of the CMP process may include a first protective agent. When the surfaces of the device layer 203 and the second dummy gate 202 are exposed by the first planarization process, the first proactive agent may be able to form the protective layer 205 on the device layer 203 and the second dummy gate 202.

The first protective agent may be any appropriate chemicals. In one embodiment, the first protective agent is $O_3$. The first polishing slurry may also include polishing particles, surfactants and stabilizers, etc. The polishing particles may include silicon oxide particles, or aluminum oxide particles, etc. The polishing particles may be used to polish the first metal layer 502. The surfactants and the stabilizers may be used to adjust the polishing speed and the flatness of the polishing surface. In one embodiment, $O_3$ may be introduced into the solution of the polishing particles, the surfactants and the stabilizers. Thus, the first polishing slurry having the first protective agent may be formed.

The first protective agent may have a significantly high oxidation ability. When the first protective agent contacts with the surface of the device layer 203, it may be easy to react with the material of the device layer 203; and the surface of the device layer 203 may be oxidized to form the protective layer 305. In one embodiment, the device layer 203 is made of polysilicon. Thus, the protective layer 305 formed by the oxidation process is made of silicon oxide. In certain other embodiments, the first protective agent may be other chemicals having a significantly high oxidation ability, such as potassium permanganate, etc.

The strength of the material of the protective layer 305 may be greater than the strength of the material of the device layer 203. When the CMP process is performed onto the first metal layer 502, the polishing rate of the protective layer 305 may be smaller than the polishing rate of the device layer 203. Thus, the surface of the device layer 203 may be protected; and the surface of the protective layer 305 may be kept flat during the first planarization process for forming the first gate electrode 512.

In one embodiment, the second dummy gate 202 may be made of polysilicon. Thus, the protective layer 305 may also be formed on the surface of the second dummy gate 202 by the first protective agent. The protective layer 305 formed on the second dummy gate 202 may prevent the protective layer 305 from being damaged by the CMP process.

Because the first protective agent may have a significantly high oxidation ability, the surface of the first metal layer 502 may also be oxidized during the first planarization process. Thus, the efficiency of the CMP process may be improved.

The concentration of the first protective agent in the first polishing slurry may be in a range of approximately 10 ppm~100 ppm. The thickness of the protective layer 205 may be in a range of approximately 10 Å~30 Å. If the concentration of the first protective agent is smaller than approximately 10 ppm, the thickness of the formed protective layer 205 may be substantially small, the protective layer 205 may be unable to protect the surfaces of the device layer 203 and the second dummy gate 202. If the concentration of the first protective agent is greater than approximately 100 ppm, the oxidation rate of the first protective agent to the first metal layer 502 may be significantly large during the first planarization process; and it may be difficult to control the first planarization process. Thus, it may cause an overly polishing issue; and the performance of the transistor may be affected.

During an existing planarization process, because the device layer 203 and the second dummy gate 202 may be easily damaged, polishing dishes may be formed on the top surface of the device layer 203 and the top surface of the second dummy gate 202. Thus, the polishing slurry may enter into the polishing dishes, and residual contaminations may be formed. The residual contaminations may affect the properties of the device layer 203. Further, the polishing dishes may cause the thickness of the second dummy gate 202 to be uneven, when the second dummy gate 202 is subsequently removed, residues of the second dummy gate 202 may be left; and the surface of the semiconductor substrate 100 under the second dummy gate 202 may be damaged. Thus, the performance of the transistor formed on the third region III may be affected. Although an oxidizer, such as $H_2O_2$, etc., may be added into the polishing slurry to cause the to-be-polished material to be oxidized; and improve the polishing efficiency, the oxidation ability of the oxidizer may be substantially low. Thus, it may be unable to form an effective protective layer on the device layer to protect the device layer 203.

For the disclosed method, the first polishing slurry of the CMP process for the first planarization process may include the first protective agent, and the first protective agent may be able to form a protective layer 305 on the surfaces of the device layer 203 and the second dummy gate 202. Because the protective layer 205 may have a significantly high anti-polishing ability, it may be able to protect the surfaces of the device layer 203 and the second dummy gate 202 during the CMP process; and to keep the surfaces of the device layer 203 and the second dummy gate 202 to be even.

Figure 9:
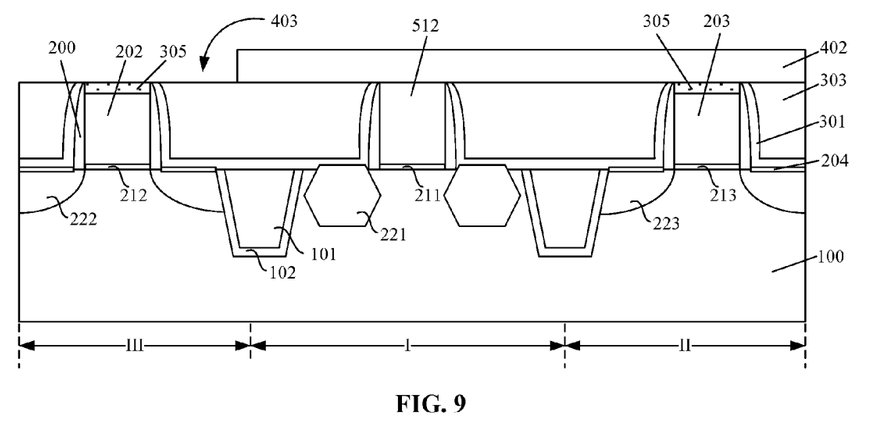

Returning to FIG. 13, after forming the first gate electrode 512, a second mask layer may be formed (S109). FIG. 9 illustrates a corresponding semiconductor structure.

As shown in FIG. 9, a second mask layer 402 having a second opening 403 is formed on the surface of the dielectric layer 303, the surface of the protective layer 305 and the surface of the first gate electrode 512. The second opening 403 may expose the surface of the second dummy gate 202. In one embodiment, because the protective layer 305 is formed on the surface of the second dummy gate 202, the second opening 403 may expose the surface of the protective layer 305 formed on the surface of the second dummy gate 202.

The second mask layer 402 may be made of any appropriate material, such as photoresist, silicon oxide, or silicon nitride, etc. In one embodiment, the second mask layer 402 is made of photoresist. A method for forming the second mask layer 402 with the second opening 403 may include forming a photoresist layer on the surfaces of the dielectric layer 330, the protective layer 305 and the first gate electrode 512; and followed by exposing and developing the photoresist layer. Thus, the second mask layer 402 with the second opening 403 may be formed.

Referring to FIG. 9, in one embodiment, the second opening 403 may expose a portion of the surface of the dielectric layer 303 at both sides of the second dummy gate 202. Thus, the entire surface of the protective layer 205 formed on the second dummy gate 202 may be exposed. Therefore, when an etching process is subsequently used to remove the second dummy gate 202 and the protective layer 305 formed on the second dummy gate 202, the entire second dummy gate 202 and the protective layer 205 formed on the second dummy gate 202 may be removed.

Figure 10:
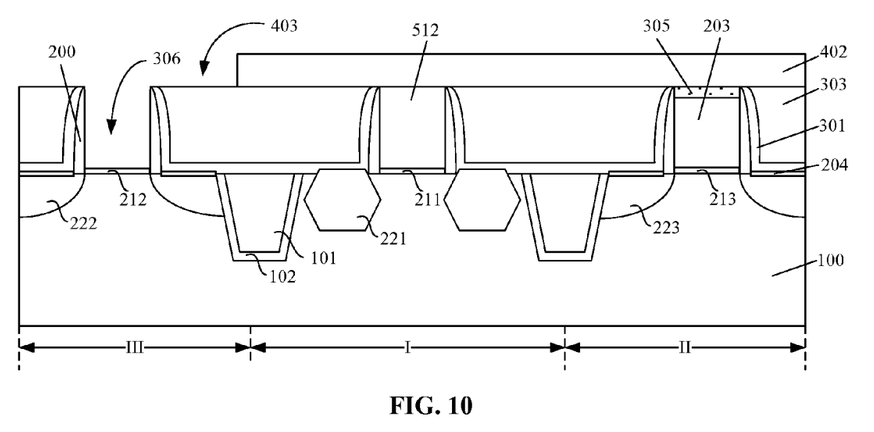

Returning to FIG. 13, after forming the second mask layer 402 with the second opening 403, the second dummy gate 202 and the protective layer 305 formed on the surface of the second dummy gate 202 may be removed (S110). FIG. 10 illustrates a corresponding semiconductor structure.

As shown in FIG. 10, the second dummy gate 202 and the protective layer 305 formed on the second dummy gate 202 are removed; and a second trench 306 is formed. The second dummy gate 202 may be removed by any appropriate process, such as a wet etching process, or a dry etching process, etc. In one embodiment, the second dummy gate 202 is removed by a dry etching process. The etching gas of the dry etching process may include $CF_4$, $SF_6$, and $O_2$, etc. Because the thickness of the protective layer 305 may be relatively small, the dry etching process may be able to remove the second dummy gate 202 and the protective layer 305 formed on the second dummy gate 202 simultaneously under the bombast of the plasma of the dry etching process.

In certain other embodiments, the second dummy gate 202 and the protective layer 305 are removed by a wet etching processes. The protective layer 305 may be removed by hydrogen fluoride firstly; and then the second dummy gate 202 may be removed by a KOH solution, or a tetramethylammonium hydroxide (TMAH) solution, etc. The wet etching processes may have a relatively high etching selectivity, it may avoid the relatively large damage to the second gate dielectric layer 212.

In one embodiment, the second gate dielectric layer 212 may be removed after removing the second dummy gate structure 202, thus the surface of the substrate 100 on the bottom of the second trench 306 may be exposed. In certain other embodiments, the second gate dielectric layer 212 may not be formed on the surface of the substrate 100. Thus, after removing the second dummy gate 202, the surface of the substrate 100 on the bottom of the second trench 306 may be exposed.

Returning to FIG. 13, after forming the second trench 306, the second mask layer 402 may be removed; and a second metal layer may be formed (S111). FIG. 11 illustrates a corresponding semiconductor structure.

As shown in FIG. 11, the second mask layer 402 is removed; and a second metal layer 504 is formed in the second trench 306 and the surfaces of the dielectric layer 303, the device layer 203; and the first gate electrode 512. The second metal layer 504 may fill the second trench 306. The second mask layer 402 may be removed by any appropriate process, such as a dry etching process, a wet etching process, or a plasma ashing process, etc.

The second metal layer 504 may be made of any appropriate metal material, such as Al, Ti, W, Ta, TiN, or TaN, etc. In one embodiment, the second metal layer 504 is made of Al. Various processes may be used to form the second metal layer 504, such as a sputtering process, an electroplating process, a PVD process, a CVD process, or an FCVD process, etc.

In certain other embodiments, the second gate dielectric layer 212 may not be formed on the bottom of the second trench 306, a second gate dielectric material layer (not shown) may be formed on the inner side surface and the bottom surface of the second trench 306 and the surfaces of the dielectric layer 303, the device layer 203, and the first gate electrode 512 before forming the second metal layer 504. The second gate dielectric material layer may be subsequently planarized to form the high-K gate dielectric layer of the transistor on the third region III. The second gate dielectric material layer may be a high-K dielectric material, such as HfO, ZrO, AlO, HfSiO, or, ZrSiO, etc. Various processes may be used to form the second gate dielectric material layer, such as a CVD process, a PVD process, or an FCVD process, etc.

In certain other embodiments, a work function layer (not shown) may be formed on the inner side surface of the second trench 306 and the surfaces of the dielectric layer 303, the device layer 203 and the first gate electrode 512 before forming the second metal layer 504. The work function layer may be used to adjust the work function of the transistor. The second metal layer 504 may be formed on the surface of the work function layer.

Returning to FIG. 13, after forming the second metal layer 504, a second planarization process may be performed onto the second metal layer 504 (S112). FIG. 12 illustrates a corresponding semiconductor structure.

As shown in FIG. 12, a portion of the second metal layer 504 higher the top surfaces of the dielectric layer 303, the first gate electrode 512 and the device layer 203 is removed by a second planarization process; and a second gate electrode 514 is formed. The second planarization process may be any appropriate process, such as a CMP process, or a physical mechanical polishing process, etc. In one embodiment, the second planarization process is a CMP process. During the second planarization process, because a protective layer 305 may be formed on the device layer 203, the CMP process of the second planarization process may not damage the device layer 203.

In one embodiment, in order to prevent the thickness of the protective layer 305 formed on the device layer 203 from being reduced by the material consumption of the first planarization process and the second planarization process, the polishing slurry, may be referred as a second polishing slurry, of the second planarization process may also include a second protective agent. If the thickness of the protective layer 305 is reduced, the protective effect of the protective layer 305 may be reduced. The second protective agent of the second planarization process may be identical to the first protective agent of the first planarization process.

Specifically, the second protective agent may have a significantly oxidation ability. The second protective agent may be any appropriate chemicals. In one embodiment, the protective agent is $O_3$. The second polishing slurry may also include polishing particles, surfactants and stabilizers, etc. The polishing particles may include silicon oxide particles, or aluminum oxide particles, etc. The polishing particles may be used to polish the second metal layer 504. The surfactants and the stabilizers may be used to adjust the polishing speed and the flatness of the polishing surface. In one embodiment, $O_3$ may be introduced into the solution of the polishing particles, the surfactants and the stabilizers. Thus, the second polishing slurry with the second protective agent may be formed. The concentration of the second protective agent in the polishing slurry may be in a range of approximately 10 ppm~100 ppm.

Referring to FIG. 12, the protective layer 305 may be kept in the subsequent processes; and an interlayer dielectric layer may be subsequently formed on the surfaces of the dielectric layer 303, the first gate electrode 512, the second gate electrode 514, and the protective layer 305 formed on the device layer 203.

Thus, a semiconductor structure may be formed by the above disclosed processes and methods; and the corresponding semiconductor structure is illustrated in FIG. 12. As shown in FIG. 12, the semiconductor structure includes a semiconductor substrate 100 having a first region I, a second region II and a third region III; and shallow trench isolation structures having a padding layer 102 formed in the semiconductor substrate 100 and an isolation layer 101 formed on the surface of the padding layer 102. The semiconductor structure also includes a first gate dielectric layer 211 formed on the surface of the semiconductor substrate 100 in the first region I and a first gate electrode 512 formed on the first gate dielectric layer 211. Further, the semiconductor structure includes a second gate dielectric layer 212 formed on the surface of the semiconductor substrate 100 in the third region III; and a second gate electrode 514 formed on the surface of the second gate dielectric layer 212.

Further, the semiconductor structure also includes a third gate dielectric layer 213 formed on the surface the semiconductor substrate 100 in the second region II, a device layer 203 formed on the third gate dielectric layer 213 and a protective layer 305 formed on the surface of the device layer 203. Further, the semiconductor structure also includes a sidewall spacer 200 formed on the side surfaces of the first gate dielectric layer 211 and the first gate electrode 512, the second gate dielectric layer 212 and the second gate electrode 514, and the third gate dielectric layer 213, the device layer 203 and the protective layer 305.

Further, the semiconductor structure also includes first source/drain regions 211 formed in the semiconductor substrate 100 at both sides of the first gate 512, second source/drain regions 212 formed in the semiconductor substrate 100 at both sides of the second gate 514 and third source/drain regions 213 formed in the semiconductor substrate 100 at both sides of the device layer 203. Further, the semiconductor structure also includes a contact etching stop layer 301 formed on the surface of the substrate 100 and covering the side surfaces of the sidewall spacer 200; and a dielectric layer 303 formed on the surface of the contact etching stop layer 301. The detailed structures and intermediate structures are described above with respect to the fabrication processes.

Therefore, according to the disclosed methods and structures, during a process for forming the first gate electrode in the first region I, a first planarization process may be performed onto the first metal layer. The first polishing slurry of the first planarization process may include a first protective agent. The first protective agent may be able to form a protective layer on the device layer. Thus, the device layer may be protected by the protective layer during the first planarization process, and the damages to the device layer may be avoided. Further, during the process for forming the second gate electrode, a second planarization process may be performed onto the second metal layer. A second proactive agent may also be added into the second polishing slurry, the thickness reduction of the protective layer formed on the device layer caused by the material consumption of the first polishing process and the second polishing process may be avoided such that the reduction of the protective effect of the protective layer may be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a semiconductor substrate having a first region and a second region;
   forming a first dummy gate on a surface of the semiconductor substrate in the first region and a device layer on the surface of the semiconductor substrate in the second region;
   forming a dielectric layer on the first dummy gate and the device layer and with a top surface leveling the top surfaces of the first dummy gate and the device layer on the semiconductor substrate;

removing the first dummy gate to form a first trench;
forming a first metal layer on the first trench to fill the first trench and on the surface of the dielectric layer and the surface of the device layer; and
performing a first planarization process on the first metal layer using a first polishing slurry having a first protective agent to form a first gate electrode in the first trench and a protective layer on the device layer preventing the device layer being damaged during the first planarization process.

2. The method according to claim 1, wherein:
the device layer has a top surface leveling with a top surface of the first dummy gate;
the dielectric layer covers side surfaces of the first dummy gate and the device layer.

3. The method according to claim 1, wherein:
the protective layer is formed on the device layer by a reaction between the first protective agent and a material of the device layer.

4. The method according to claim 3, wherein:
a thickness of the protective layer is in a range of approximately 10 Å~30 Å.

5. The method according to claim 1, wherein:
the first protective agent is $O_3$; and
a concentration of the first protective agent is in a range of approximately 10 ppm~100 ppm.

6. The method according to claim 1, wherein:
the device layer is made of polysilicon.

7. The method according to claim 1, wherein:
the semiconductor substrate includes a third region;
a second dummy gate structure is formed on the surface of the semiconductor substrate in the third region; and
a top surface of the second dummy gate levels with the top surface of the first dummy gate.

8. The method according to claim 7, wherein:
a protective layer is formed on the surface of the second dummy gate during the first planarization process.

9. The method according to claim 8, after forming the first gate electrode, further including:
removing the second dummy gate to form a second trench;
forming a second metal layer on an inner side surface of the second trench, the surface of the dielectric layer and a surface of the first gate electrode; and
performing a second planarization process using a second polishing slurry having a second protective agent to remove a portion of the second metal layer on the surface the dielectric layer, the surface of the protective layer, and the surface of the first gate electrode to form a second gate electrode in the second trench.

10. The method according to claim 9, wherein:
the second protective agent is $O_3$; and
a concentration of the second protective agent is a range of approximately 10 ppm~100 ppm.

11. The method according to claim 9, wherein:
the first planarization process is a chemical mechanical polishing process; and
the second planarization process is a chemical mechanical polishing process.

12. The method according to claim 9, wherein:
a second gate dielectric layer is formed between the second gate electrode and the surface of the semiconductor substrate; and
the second gate dielectric layer is made of HfO, ZrO, AlO, HfSiO, or ZrSiO.

13. The method according to claim 9, wherein:
the second metal layer is made of Al, Ti, W, Ta, TiN, or TaN.

14. The method according to claim 9, further including:
forming first source/drain regions in the semiconductor substrate at both sides of the first gate electrode; and
forming second source/drain regions in the semiconductor substrate at both sides of the second gate electrode.

15. A semiconductor structure, comprising:
a semiconductor substrate having a first region and a second region;
a first gate electrode formed on a surface of semiconductor substrate in the first region by a first planarization process using a first polishing slurry including a first protective agent;
a device layer formed on the surface of the semiconductor substrate in the second region;
a protective layer formed on a top surface of the device layer by a reaction between the first protective agent and the device layer during the first planarization process such that the device layer is not damaged from the first planarization process;
first source/drain regions formed in the semiconductor substrate at both sides of the first gate electrode; and
second source/drain regions formed in the semiconductor substrate at both sides of the device layer.

16. The semiconductor structure according to claim 15, wherein the first gate electrode is formed by:
forming a first dummy gate on the surface of the semiconductor substrate in the first region and the device layer with a top surface leveling with the top surface of the first dummy gate on the surface of the semiconductor substrate in the second region;
forming a dielectric layer covering side surfaces of the first dummy gate and the device layer and with a top surface leveling the top surfaces of the first dummy gate and the device layer on the semiconductor substrate;
removing the first dummy gate to form a first trench;
forming a first metal layer on an inner side surface of the first trench to fill up the first trench, on the surface of the dielectric layer and the surface of the device layer; and
performing the first planarization process onto the first metal layer using the first polishing slurry having the first protective agent to form a first gate electrode in the first trench and the protective layer.

17. The semiconductor structure according to claim 16, wherein:
the first protective agent is $O_3$; and
a concentration of $O_3$ is in a range of approximately 10 ppm~100 ppm.

18. The semiconductor structure according to claim 16, wherein:
the first metal layer is made of Al, Ti, W, Ta, TiN, or TaN.

19. The semiconductor structure according to claim 15, wherein:
the semiconductor substrate has a third region; and
a second gate electrode is formed on the surface of the semiconductor substrate in the third region.

20. The semiconductor structure according to claim 19, wherein:
the second electrode is formed by planarizing a second metal layer using a second polishing slurry having $O_3$ as a second protective region.

* * * * *